US012261529B2

(12) United States Patent
Priego et al.

(10) Patent No.: US 12,261,529 B2
(45) Date of Patent: Mar. 25, 2025

(54) POWER-SAVE MODE FOR FIXED-FREQUENCY DC-DC CONVERTER

(71) Applicant: Texas Instruments Incorporated, Dallas, TX (US)

(72) Inventors: Antonio Priego, Freising (DE); Gerhard Thiele, Dachau (DE); Erich-Johann Bayer, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 247 days.

(21) Appl. No.: 17/955,950

(22) Filed: Sep. 29, 2022

(65) Prior Publication Data

US 2023/0308019 A1  Sep. 28, 2023

Related U.S. Application Data

(60) Provisional application No. 63/324,428, filed on Mar. 28, 2022.

(51) Int. Cl.
| | |
|---|---|
| *H02M 3/158* | (2006.01) |
| *H02M 1/00* | (2006.01) |
| *H03F 3/345* | (2006.01) |
| *H03K 17/06* | (2006.01) |
| *H03K 17/687* | (2006.01) |
| *H03K 19/173* | (2006.01) |

(52) U.S. Cl.
CPC ......... *H02M 3/158* (2013.01); *H02M 1/0032* (2021.05); *H03F 3/345* (2013.01); *H03K 17/063* (2013.01); *H03K 17/687* (2013.01); *H03K 19/173* (2013.01)

(58) Field of Classification Search
CPC ..... H02M 1/0032; H02M 3/158; H03F 3/345; H03K 17/063; H03K 17/687; H03K 19/173
See application file for complete search history.

(56) References Cited

U.S. PATENT DOCUMENTS

| | | | |
|---|---|---|---|
| 8,077,490 B1 * | 12/2011 | Prodic ................... | H02M 3/158 700/297 |
| 8,693,223 B2 | 4/2014 | Lin | |
| 9,584,019 B2 * | 2/2017 | Shiwaya ............... | H02M 3/158 |
| 9,899,931 B1 | 2/2018 | Chang et al. | |
| 9,973,098 B2 | 5/2018 | Phadke et al. | |

(Continued)

*Primary Examiner* — Harry R Behm
(74) *Attorney, Agent, or Firm* — Ray A. King; Frank D. Cimino

(57) ABSTRACT

In a circuit for DC-DC voltage converters, an amplifier has first and second inputs coupled to a reference voltage terminal and an output voltage terminal, respectively. A comparator has first and second inputs coupled to an amplifier output and a switching terminal, respectively. A logic circuit has inputs coupled to the comparator output and a clock terminal. A driver circuit has first and second inputs coupled to first and second logic outputs, respectively. A first transistor having a first control terminal coupled to the first driver output is coupled between a supply voltage terminal and the switching terminal. A second transistor is coupled between the switching terminal and a ground terminal, and has a second control terminal coupled to the second driver output. A threshold detection circuit is configured to provide a threshold signal responsive to a current through the second transistor crossing a current threshold.

17 Claims, 6 Drawing Sheets

(56) References Cited

U.S. PATENT DOCUMENTS

| | | |
|---|---|---|
| 10,574,147 B2 | 2/2020 | King |
| 10,784,767 B1 | 9/2020 | Li et al. |
| 10,845,833 B1* | 11/2020 | Dietrich ................ H02M 3/157 |
| 11,234,308 B2 | 1/2022 | Bao et al. |
| 2009/0322299 A1* | 12/2009 | Michishita ............ H02M 3/156 |
| | | 323/282 |
| 2015/0222181 A1* | 8/2015 | Coleman ................ H02M 3/156 |
| | | 323/288 |
| 2019/0036459 A1 | 1/2019 | Ding et al. |
| 2021/0083579 A1* | 3/2021 | Hsu ......................... H03K 7/08 |
| 2022/0345040 A1* | 10/2022 | Couleur .............. H02M 1/0009 |

* cited by examiner

POWER-SAVE MODE FOR FIXED-FREQUENCY DC-DC CONVERTER

CROSS-REFERENCE TO RELATED APPLICATION

This application claims priority to U.S. Provisional Patent Application No. 63/324,428 filed Mar. 28, 2022, which is incorporated herein by reference.

BACKGROUND

This description relates to DC-DC buck voltage converters, such as voltage converters used in automotive infotainment and cluster systems, Advanced Driver Assistance Systems (ADAS), optical networks, storage, and digital core voltage supplies. The requirements for voltage converters in the automotive market can include operating at a fixed switching frequency, handling large load current transients, and tight output voltage regulation (e.g. +/−2% AC error).

A buck voltage converter is a DC-DC voltage converter having a lower output voltage than input voltage. Switching buck voltage converters usually provide better power efficiency than linear buck voltage converters. Linear buck voltage regulators reduce the voltage between the input and the output by dissipating excess power as heat, which reduces power efficiency. Operating at a fixed frequency and maintaining a minimum power efficiency at light current loads are common buck voltage converter requirements.

SUMMARY

In a first example, a circuit for use in a DC-DC voltage converter includes an amplifier having an amplifier output and first and second amplifier inputs. The first amplifier input is coupled to a reference voltage terminal, and the second amplifier input is coupled to an output voltage terminal. A comparator has a comparator output and first and second comparator inputs. The first comparator input is coupled to the amplifier output, and the second comparator input is coupled to a switching terminal.

A logic circuit has first, second and third logic inputs, and first and second logic outputs. The first logic input is coupled to the comparator output, and the second logic input is coupled to a clock terminal. A driver circuit has first and second driver inputs, and first and second driver outputs. The first driver input is coupled to the first logic output, and the second driver input is coupled to the second logic output.

A first transistor has a first control terminal that is coupled to the first driver output. The first transistor is coupled between a supply voltage terminal and the switching terminal. A second transistor has a second control terminal coupled to the second driver output. The second transistor is coupled between the switching terminal and a ground terminal. A threshold detection circuit has a threshold detection input and a threshold detection output. The threshold detection input is coupled to the second transistor. The threshold detection output is coupled to the third logic input. The threshold detection circuit is configured to provide a threshold signal at the threshold detection output responsive to a current through the second transistor crossing a current threshold.

In a second example, a voltage regulator circuit includes an amplifier having an amplifier output and first and second amplifier inputs. The first amplifier input is coupled to a reference voltage terminal, and the second amplifier input is coupled to an output voltage terminal. A comparator has a comparator output and first and second comparator inputs. The first comparator input is coupled to the amplifier output, and the second comparator input is coupled to a switching terminal.

A state machine has first, second and third state inputs, and first and second state outputs. The first state input is coupled to the comparator output, and the second state input is coupled to a clock terminal. A driver circuit has first and second driver inputs, and first and second driver outputs. The first driver input is coupled to the first state output, and the second driver input is coupled to the second state output. A first transistor has a first control terminal coupled to the first driver output. The first transistor is coupled between a supply voltage terminal and the switching terminal. A second transistor has a second control terminal coupled to the second driver output. The second transistor is coupled between the switching terminal and a ground terminal.

DETAILED DESCRIPTION

In this description, the same reference numbers depict same or similar (by function and/or structure) features. The drawings are not necessarily drawn to scale.

A minimum power efficiency is frequently specified for DC-to-DC switching converters. In some applications, such as automotive, fixed-frequency operation may be a requirement, including at light current loads. Hysteretic-based buck converters maintain voltage regulation using a comparator having hysteresis that compares an output voltage to a reference voltage and provides a difference signal at its output.

Hysteretic-based buck converters are capable of operating at a fixed switching frequency during normal operation using any one of several methods. One method for improving power efficiency at light loads in hysteretic-based buck converters uses pulse frequency modulation (PFM) mode. However, operating a hysteretic-based buck converter in PFM mode may lead to a linear decrease in frequency as the load current decreases if the inductor valley current reaches zero. Reducing the switching frequency violates the voltage converter requirements if one of those requirements is operating at a fixed frequency.

Figure 1:
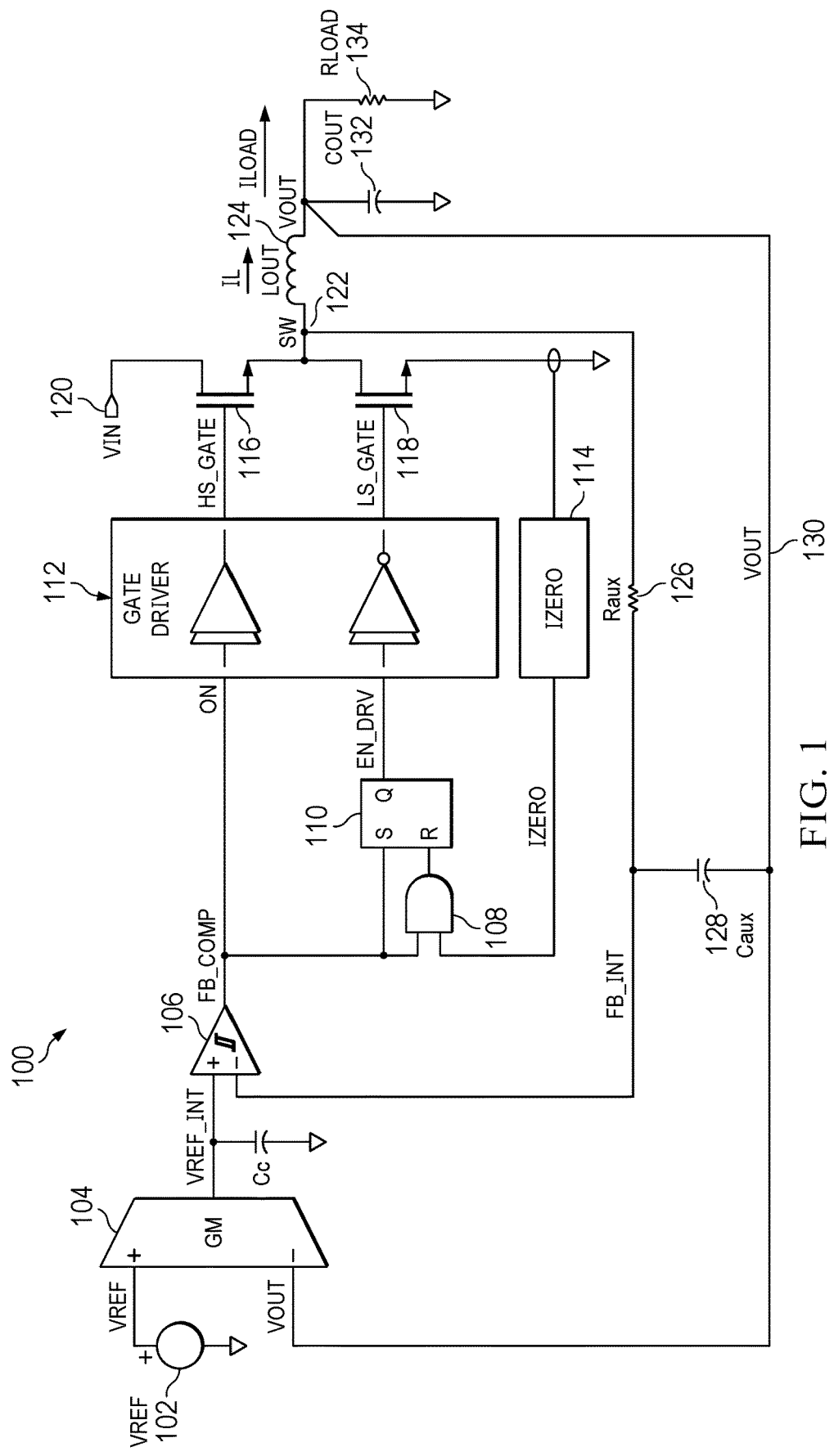
FIG. 1 shows a schematic diagram of an example hysteretic-based buck converter that supports pulse frequency modulation (PFM).

FIG. 1 shows a schematic diagram of an example hysteretic-based buck converter 100 that supports the use of PFM. The input voltage for buck converter 100 is VIN 120, and the output voltage is VOUT 130. A transconductance amplifier 104 has a first input coupled to VREF 102, and a second input coupled to VOUT 130. The output of transconductance amplifier 104, VREF_INT, is coupled to a first input of comparator 106. In at least one case, comparator 106 is a hysteretic comparator. However, comparator 106 could instead be a comparator without hysteresis.

The second input of comparator 106 receives a signal from a switch terminal SW 122, which is coupled to the source of transistor 116 and the drain of transistor 118. The signal from the switch terminal SW 122 can be low pass filtered to transform the signal from a square wave to a triangle wave, FB_INT, using resistor 126 and capacitor 128. Resistor 126 is coupled between the switch terminal SW 122 and the second input of comparator 106. Capacitor 128 is coupled between the second input of comparator 106 and VOUT 130.

The output of comparator 106 is coupled to a first input of AND gate 108 and to a first input of a latch 110. In at least one example, latch 110 is an SR flip-flop and the first input is a set input. A second input to AND gate 108 is coupled to the output of IZERO circuit 114. IZERO circuit 114 detects when the current through inductor 124 crosses a threshold at zero amps. The output of AND gate 108 is coupled to a second input of latch 110, which is a reset input of an SR flip-flop in at least one example.

The output of comparator 106, FB_COMP, is coupled to a first input of gate driver circuit 112. The output of latch 110, EN_DRV, is coupled to a second input of gate driver circuit 112. A first output of gate driver circuit 112 is coupled to the gate of transistor 116. A second output of gate driver circuit 112 is coupled to the gate of transistor 118. Transistor 116 is coupled between VIN 120 and switch terminal SW 122. Transistor 118 is coupled between switch terminal SW 122 and a ground terminal. Inductor 124 is coupled between the switch terminal SW 122 and VOUT 130. Capacitor 132 and resistor 134 are coupled in parallel between VOUT 130 and the ground terminal.

Transconductance amplifier 104 compares the voltage at VOUT 130 to a reference voltage VREF 102, and provides an error signal VREF_INT at its output, which provides output voltage regulation. IZERO circuit 114 has an input signal proportional to the current through transistor 118. This current signal is compared to a reference current signal. In at least one example, the reference current signal is zero, making IZERO circuit 114 a zero-current detection circuit by detecting when the current through inductor 124 reverses polarity.

A power save mode is implemented in buck converter 100 using the IZERO circuit 114, latch 110, and AND gate 108. IZERO circuit 114 is an inductor zero-current detector. When the current through inductor 124 reverses polarity, the output of IZERO circuit 114 causes a reset of latch 110. Resetting latch 110 disables gate driver circuit 112, turning off transistor 116 and transistor 118. Buck converter 100 thus operates in pulse frequency modulation (PFM) mode, which increases the efficiency of buck converter 100 at light loads by reducing switching losses. However, this increase in efficiency at light loads may come at the expense of violating a regulator specification by reducing the switching frequency.

VREF_INT is the reference voltage for the hysteretic comparator. A replica of the current through inductor 124 is generated by lowpass filtering the signal at switch terminal SW 122 using resistor 126 and capacitor 128. This replica current is superimposed on the VOUT 130 signal and provided to the hysteretic comparator as feedback information. As the inductor current (IL) falls, the IZERO output signal pulses when the current reaches zero. The state machine then enters the pause state and gate driver circuit 112 is disabled. Current is then supplied to the load by discharging capacitor 132. As capacitor 132 discharges, the voltage at VOUT 130 falls. When VOUT 130 reaches the voltage of VREF_INT, the output of comparator 106 goes high, initiating a new high side drive phase. Entering the PAUSE state results in a drop in the operating frequency, which is undesirable.

Figure 2:
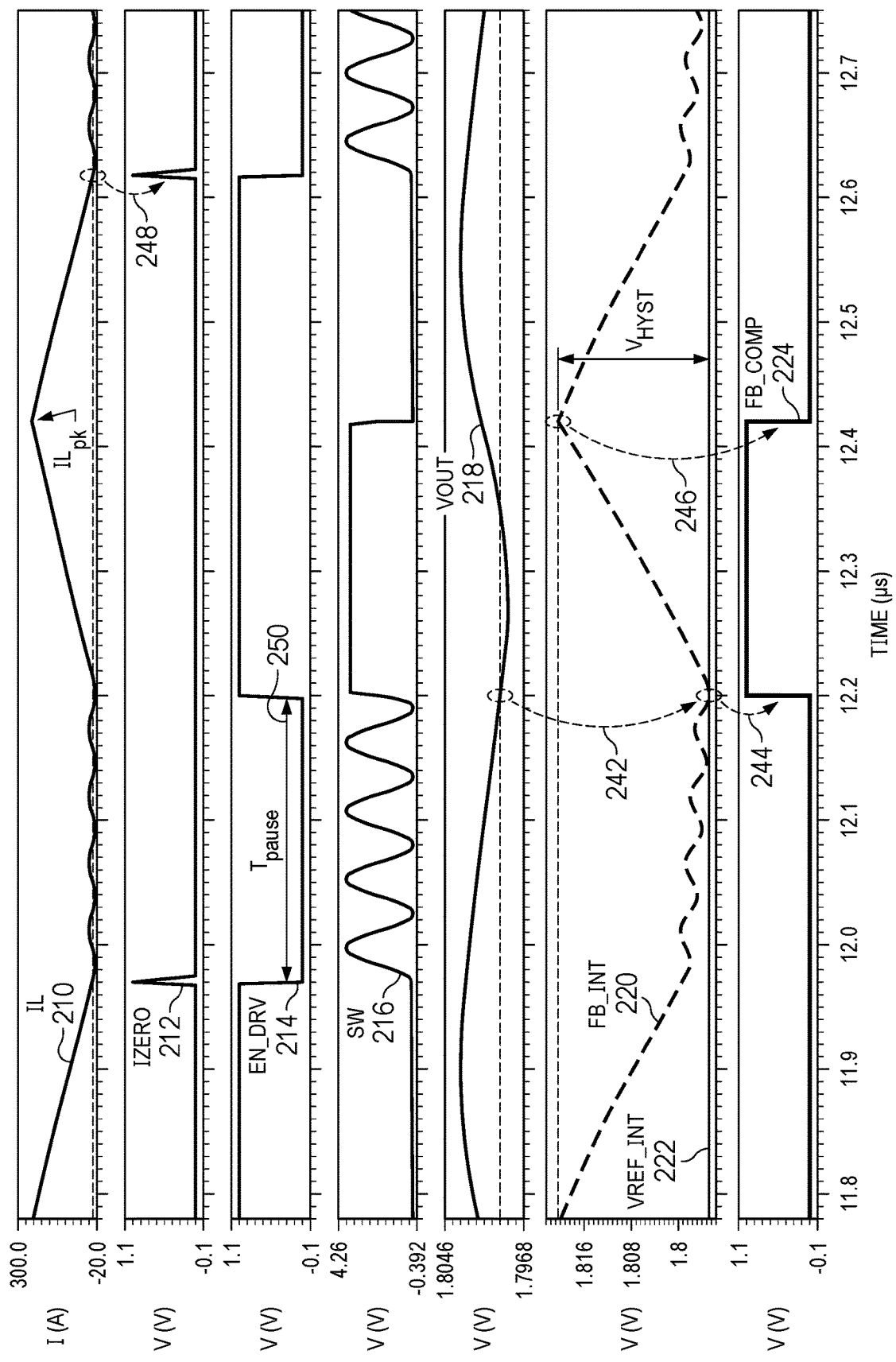
FIG. 2 shows an example timing diagram for signals in a hysteretic buck voltage converter operating in PFM mode.

FIG. 2 shows an example timing diagram 200 for signals in hysteretic-based buck converter 100 operating in PFM mode. Signal 210 is the current IL through inductor 124. Signal 212 is the output of the IZERO circuit 114. Signal 214 is the output EN_DRV of latch 110. Signal 216 is the signal at the switch terminal SW 122. Signal 218 is the output voltage VOUT 130. Signal 220 is the signal FB_INT at the second input of comparator 106. Signal 222 is the reference voltage VREF 102. Signal 224 is the signal FB_COMP at the output of comparator 106.

The converter will not switch as long as the voltage at VOUT 218 remains above the reference voltage VREF, and the outputs of gate driver circuit 112 remain in high-impedance mode. At 242, the voltage at VOUT 218 falls below the reference voltage VREF, causing the voltage FB_INT 220 to fall below the voltage VREF_INT 222. At 244, this is detected by comparator 106, and FB_COMP 224 transitions high. FB_COMP 224 transitioning high causes the output of latch 110 EN_DRV 214 to go high, enabling gate driver circuit 112 to turn on transistor 116. With transistor 116 turned on, the current IL and its replica signal, FB_INT, increase.

At 246, FB_INT reaches the upper threshold of the hysteretic window of comparator 106, making FB_COMP low. Transistor 116 is turned off and transistor 118 is turned on. At 248, the IZERO circuit 114 detects zero current through inductor 124, causing IZERO 212 to pulse high, resetting latch 110. Resetting latch 110 disables gate drive circuit 112, turning off transistors 116 and 118, and putting the power stage in high impedance mode. Transistors 116 and 118 will remain off until VOUT 218 falls below the reference voltage.

If the valley current through the inductor falls to zero as the load current is reduced, the only means that hysteretic-based buck converter 100 has to reduce the energy generated per cycle is to increase $T_{pause}$ 250, thus reducing the converter operating frequency. However, this is not an acceptable solution for a system that is specified to maintain a constant operating frequency.

Figure 3:
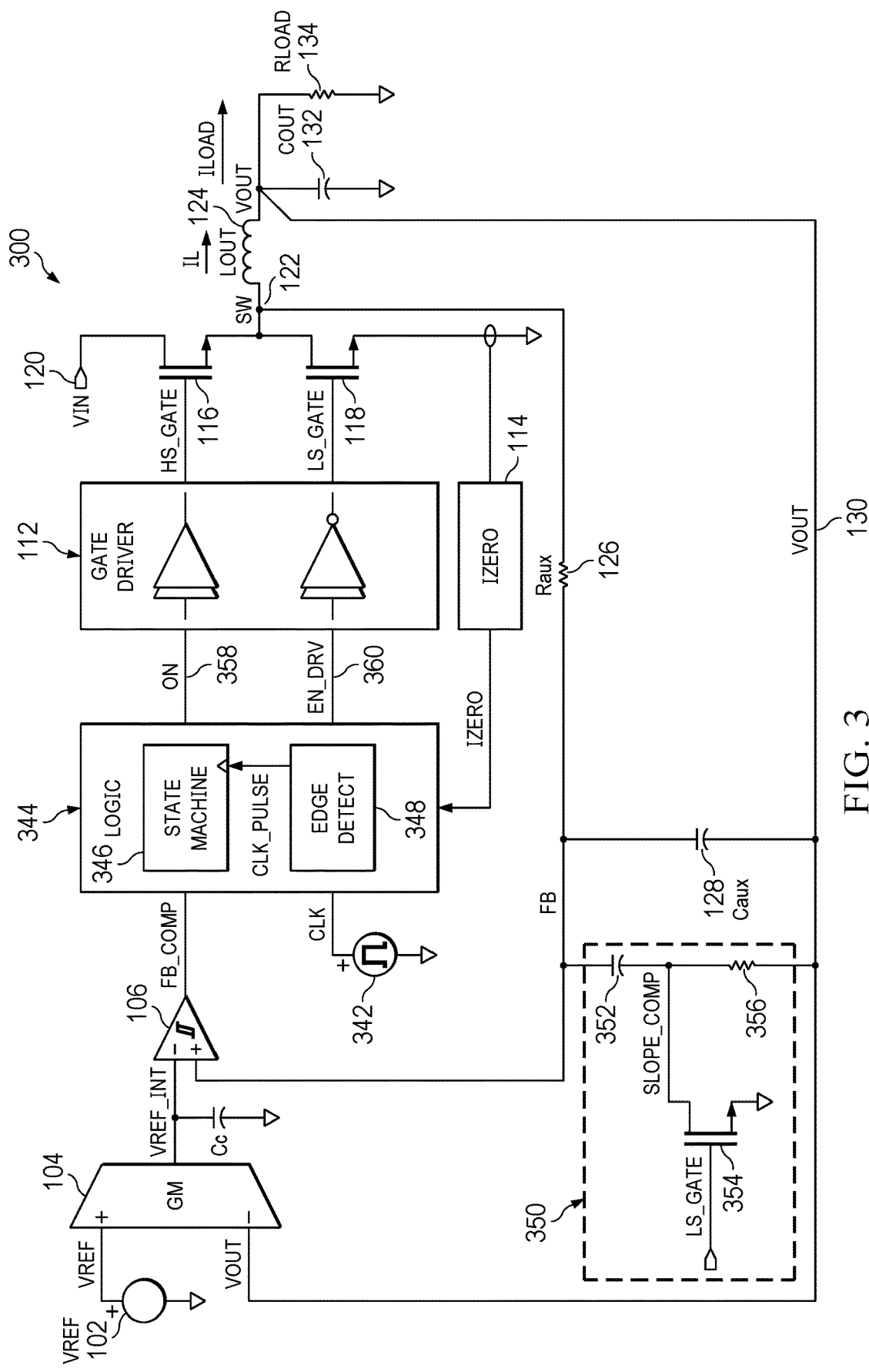
FIG. 3 shows a schematic diagram of an example hysteretic-based buck voltage converter that supports discontinuous conduction mode (DCM) for fixed frequency operation and PFM mode at low currents.

FIG. 3 shows a schematic diagram of an example hysteretic-based buck converter 300 that supports discontinuous conduction mode (DCM) for fixed frequency operation and PFM mode for low load currents. The input voltage for hysteretic-based buck converter 300 is VIN 120, and the output voltage is VOUT 130. A transconductance amplifier 104 has a first input coupled to VREF 102, and a second input coupled to VOUT 130. The output of transconductance amplifier 104, COMP, is coupled to a first input of comparator 106. In at least one case, comparator 106 is a hysteretic comparator, but comparator 106 could instead be a comparator without hysteresis.

The second input of comparator 106 receives a signal from switch terminal SW 122, which is coupled to the source of transistor 116 and the drain of transistor 118. The signal from the switch terminal SW 122 can be low pass filtered by resistor 126 and capacitor 128 to transform the signal from a square wave to a triangle wave. Resistor 126 is coupled between the switch terminal SW 122 and the second input of comparator 106. Capacitor 128 is coupled between the second input of comparator 106 and VOUT 130.

The output of comparator 106, FB_COMP, is coupled to a first input of logic circuit 344. A second input of logic circuit 344 is coupled to the output of IZERO circuit 114. IZERO circuit 114 detects when the current through inductor 124 crosses a threshold. In at least one example, that threshold is at zero amps. A third input of logic circuit 344 is coupled to a clock terminal 342.

Logic circuit 344 includes a state machine 346 and an edge detection circuit 348. The input of edge detection circuit 348 is coupled to the clock terminal 342, and the output of edge detection circuit 348 is coupled to a first input of state machine 346. In at least one example, edge detection circuit 348 is omitted and the first input of state machine 346 is directly coupled to the clock terminal 342.

A first output of logic circuit 344, ON, is coupled to a first input of gate driver circuit 112. A second output of logic circuit 344, EN_DRV, is coupled to a second input of gate driver circuit 112. A first output of gate driver circuit 112 is coupled to the gate of transistor 116. A second output of gate driver circuit 112 is coupled to the gate of transistor 118. Transistor 116 is coupled between VIN 120 and switch terminal SW 122. Transistor 118 is coupled between switch terminal SW 122 and a ground terminal. Inductor 124 is coupled between the switch terminal SW 122 and VOUT 130. Capacitor 132 and resistor 134 are coupled in parallel between VOUT 130 and the ground terminal.

In at least one example, hysteretic-based buck converter 300 includes a slope compensation circuit 350. Slope compensation circuit 350 includes capacitor 352, resistor 356 and transistor 354. Capacitor 352 is coupled between the second input of comparator 106 and a terminal, SLOPE_COMP. Resistor 356 is coupled between the SLOPE_COMP terminal and VOUT 130. Transistor 354 is coupled between resistor 356 and the ground terminal.

Transconductance amplifier 104 compares the voltage at VOUT 130 to a reference voltage VREF 102, and provides an error signal VREF_INT at its output, providing output voltage regulation. A high DC gain in transconductance amplifier 104 allows improved regulation of the output voltage VOUT 130. Compensation capacitor Cc improves the stability of the outer regulation loop. IZERO circuit 114 has as its input a signal proportional to the current through transistor 118. This current signal can be compared to a reference current signal. In at least one example, the reference current signal is zero, making IZERO circuit 114 a zero-current detection circuit by detecting when the current through inductor 124 reverses polarity.

Figure 4:
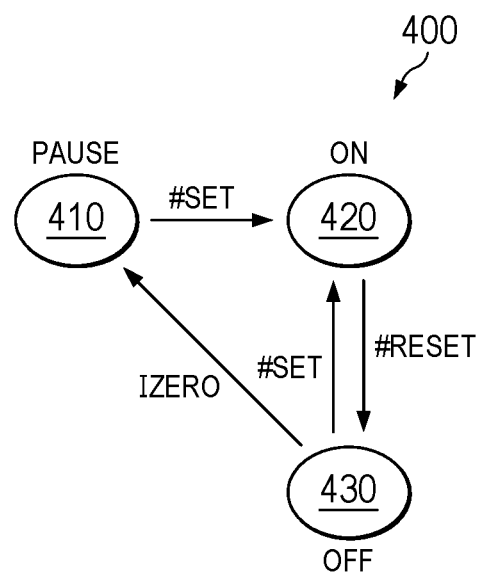
FIG. 4 shows a state diagram for a state machine in a hysteretic-based buck voltage converter.

FIG. 4 shows a state diagram 400 for state machine 346. State machine 346 is configured with three states. The first state is a PAUSE state 410. In the PAUSE state, transistors 116 and 118 are off. The second state is an ON state 420. In the ON state, transistor 116 is on and transistor 118 is off. The third state is an OFF state 430. In the OFF state, transistor 116 is off and transistor 118 is on. The inputs to state machine 346 are CLK_PULSE, FB_COMP, and IZERO. The outputs of state machine 346 are EN_DRV and ON. EN_DRV is a signal that enables the gate driver. ON is a signal that reports if transistor 116 is on and transistor 118 is off, or if transistor 116 is off and transistor 118 is on.

The state machine begins in the PAUSE state 410. A SET command occurs when CLK_PULSE pulses high and FB_COMP is low. When the SET command is received, the voltage at VOUT 130 is below the reference voltage VREF 102. A SET command causes state machine 346 to transition from the PAUSE state 410 to the ON state 420. The ON state 420 begins with the rising edge of the clock, and ends with the inductor current hitting a peak value. A RESET command occurs if FB_COMP goes high while the state machine 346 is in the ON state 420. A RESET command causes state machine 346 to transition from the ON state 420 to the OFF state 430.

During the OFF state, if the CLK signal occurs before the IZERO signal goes high, state machine 346 will transition from the ON state 420 to the OFF state 430. From the OFF state 430, state machine 346 can either transition back to the ON state 420 (CCM) or to the PAUSE state 410 (DCM or PFM). IZERO going high will trigger a transition from the OFF state 430 to the PAUSE state 410. If, during the OFF state, the inductor current falls below zero amps before the rising edge of CLK, state machine 346 will transition from the OFF state to the PAUSE state 410.

Hysteretic-based buck converter 300 is in DCM if $T_{PAUSE}$ is less than $T_{SW}-T_{ON}$, where $T_{SW}$ is the period of one switching cycle, and $T_{ON}$ is the on-phase duration. Hysteretic-based buck converter 300 is in PFM if $T_{PAUSE}$ is larger than $T_{SW}-T_{ON}$.

If the output of comparator 106 has not been reset to zero, the output voltage VOUT 130 is higher than its specified voltage. The state machine will remain in the PAUSE state as long as VOUT 130 is higher than the reference voltage, and transistors 116 and 118 will remain off. In this case, the load current is supplied by capacitor 132. When FB_COMP goes to zero, a SET command occurs at the next rising edge of the clock and state machine 346 transitions from the PAUSE state 410 to the ON state 420, turning on transistor 116.

When transistors 116 and 118 are both off, inductor 124 does not conduct current. So, the voltage at the switch terminal SW 122 is equal to the voltage at VOUT 130. If the voltage at VOUT 130 is above reference voltage VREF 102, the output of comparator 106 will be high. When the voltage at VOUT 130 decreases to the voltage of reference voltage VREF 102, FB_COMP goes to zero. With FB_COMP at zero, a CLK pulse transitions state machine 346 into the ON state 420, enabling gate driver circuit 112 and turning on transistor 116.

Transistor 116 being turned on increases the current through inductor 124. When the replicated current reaches the peak value as determined by VREF_INT, FB_COMP goes high, producing a RESET signal. The RESET signal causes state machine 346 to transition from the ON state 420 to the OFF state 430, which turns off transistor 116 and turns on transistor 118. The current IL through inductor 124 will then decrease. If the load current ILOAD is relatively low, the current IL through inductor 124 may reach zero before the next CLK rising edge occurs. When the current through inductor 124 reaches zero, IZERO will pulse high. If IZERO pulses high before the rising edge of CLK occurs, state machine 346 will transition from the OFF state 430 to the PAUSE state 410. The state machine transitions from CCM to DCM.

In DCM, the voltage control loop reduces the inductor current. When the inductor valley current reaches zero, the current reversal is detected by the IZERO circuit 114, interrupting the ramp down of inductor current by setting the gate driver circuit 112 in high impedance mode.

Figure 5:
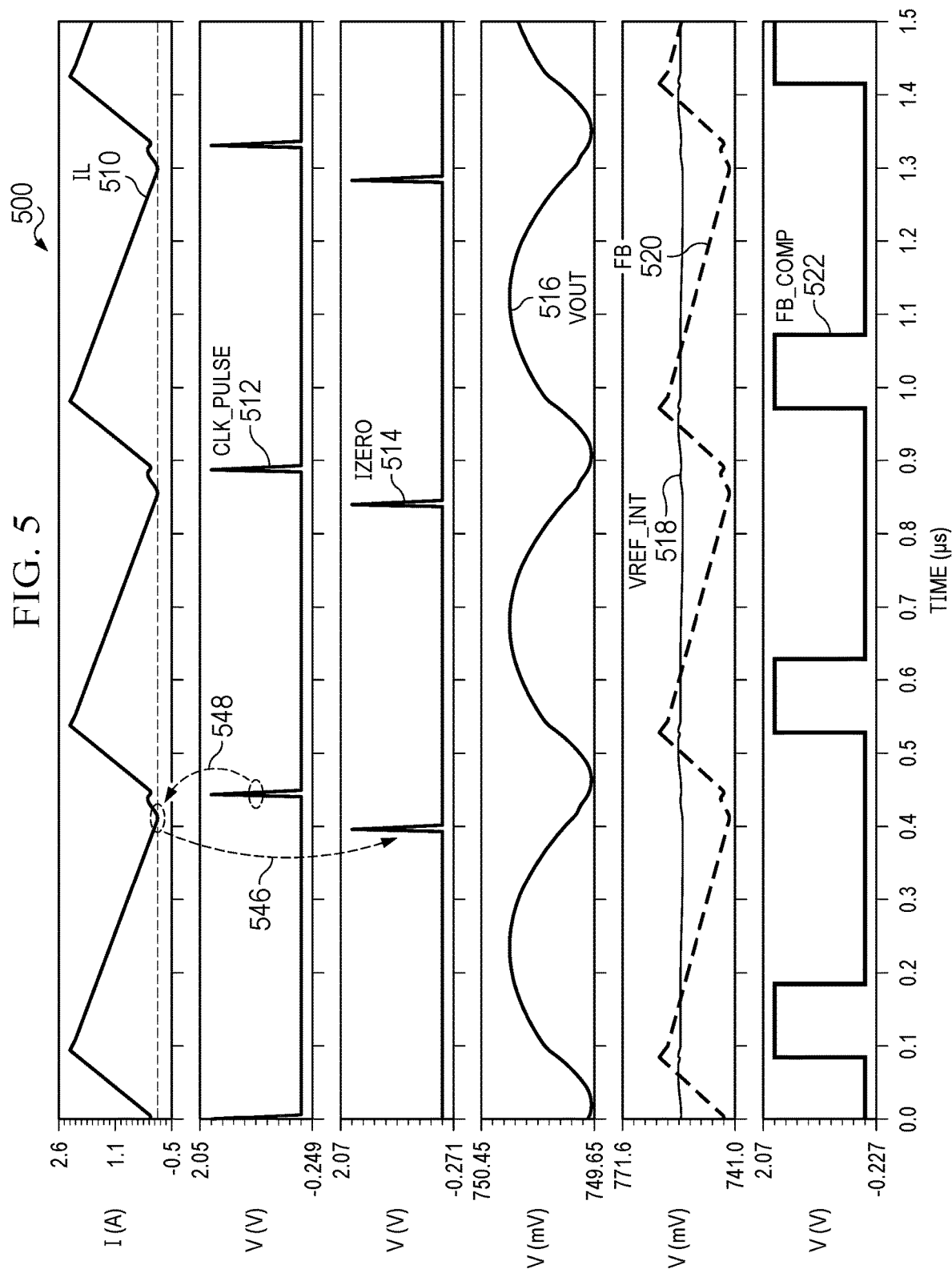
FIG. 5 shows an example timing diagram for signals in a buck voltage converter operating in a CCM-DCM boundary state.

FIG. 5 shows an example timing diagram 500 for signals in hysteretic-based buck converter 300 operating in a CCM-DCM boundary state. Signal 510 is the current IL through inductor 124. Signal 512 is the clock input to the state machine from CLK. Signal 514 is the output of the IZERO circuit 114. Signal 516 is the output voltage VOUT 130. Signal 518 is the VREF_INT signal at the first input of comparator 106. Signal 520 is the signal FB at the second input of comparator 106. Signal 522 is the signal FB_COMP at the output of comparator 106.

At 546, the inductor current IL 510 falls below zero, which results in a high pulse on IZERO 514. In response to the high pulse on IZERO 514, the state machine enters the PAUSE state 410, resulting in EN_DRV 360 going low. A low on EN_DRV 360 places the outputs of gate driver circuit 112 in high-impedance mode and turns off transistor 116 and 118. At 548, the next cycle of CLK_PULSE 512 occurs. Because VOUT 130 is within specification, FB_COMP is low and the CLK pulse propagates through, resulting in state machine 346 transitioning to the ON state 420. With the transition to the ON state 420, EN_DRV 360 goes high, enabling the gate driver circuit 112 to turn transistor 116 on.

This sequence eliminates the need for an unnecessary discharge of capacitor 132 to prevent output voltage runaway in hysteretic-based buck converter 300. Eliminating unnecessary discharges of capacitor 132 provides an improvement in the efficiency of hysteretic-based buck converter 300. The buck voltage converter resumes periodic switching activity with the next cycle of CLK_PULSE 512, allowing hysteretic-based buck converter 300 to maintain fixed-frequency operation.

Figure 6:
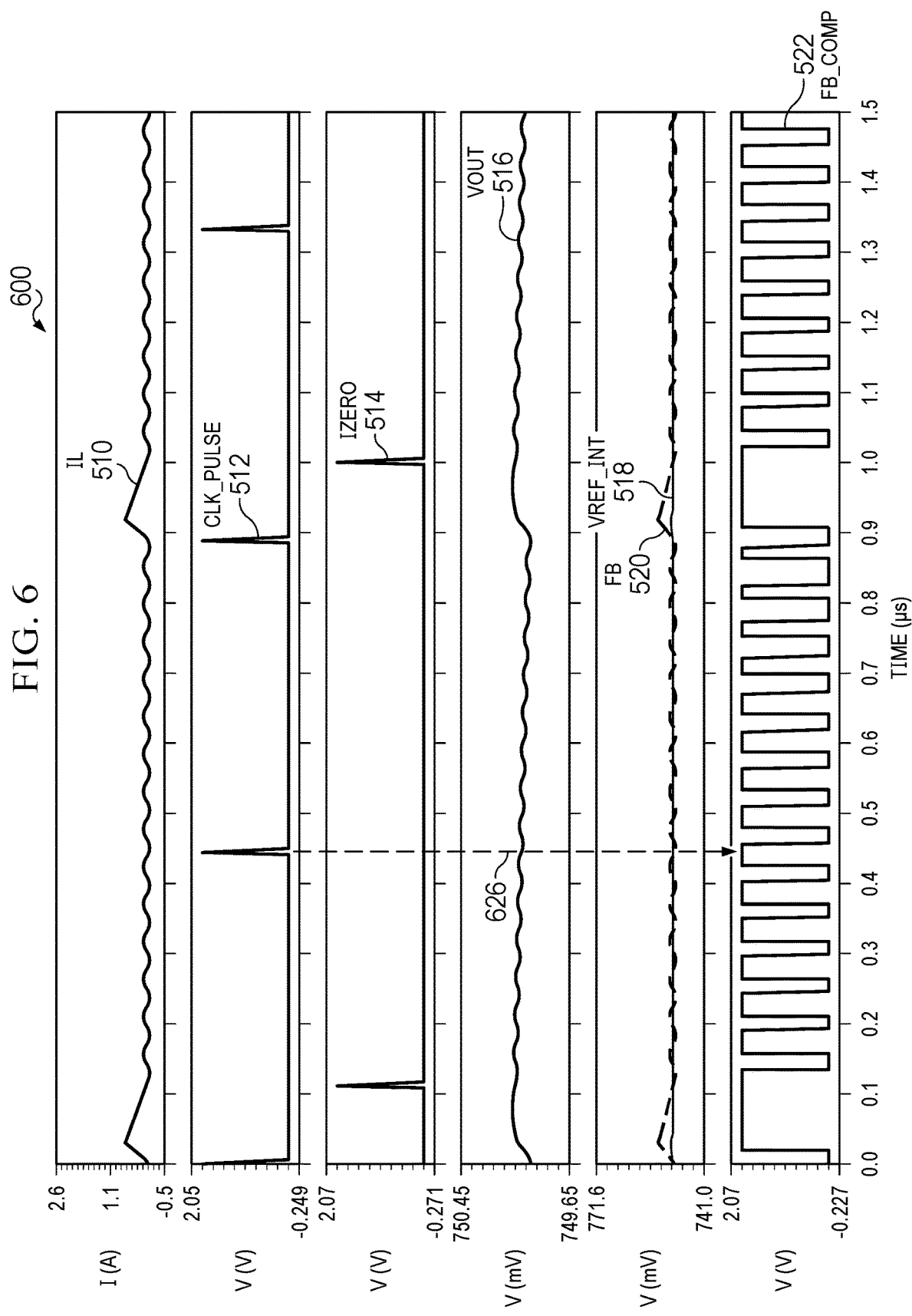
FIG. 6 shows an example timing diagram for signals in a buck voltage converter operating in PFM mode.

FIG. 6 shows an example timing diagram 600 for signals in hysteretic-based buck converter 300 operating in PFM mode. FB_COMP 522 toggles high and low due to ringing at the switch terminal SW 122 being coupled into the second input of comparator 106. At 626, CLK_PULSE pulses high as FB_COMP goes high. However, the clock is masked and the pulse is skipped. The switching frequency drops as a result of entering this mode. However, the difference is that the reduction in frequency occurs at a load current that is at least one order of magnitude lower than it would have been with buck converter 100.

The state machine is configured to allow only one ON-phase during each clock switching cycle, and the ON phase is synchronized with the system clock. This keeps the maximum converter switching frequency the same as the frequency set by the system clock. A situation can occur at light loads in which noise causes multiple switching cycles, which can increase the output voltage ripple. However, if this occurs, the output voltage ripple will remain relatively low despite the multiple pulses because the peak output current is significantly lower than the inductor current ripple in CCM.

Requirements for the gate driver operation in a buck voltage regulator may limit the minimum inductor peak current, resulting in a minimum amount of energy being generated during each clock pulse. If this minimum amount of energy exceeds the load current that is needed, the output voltage VOUT 130 will rise above the specified output voltage. This rise in voltage will be sensed by comparator 106 as the voltage at FB rises, and FB_COMP will go high. By masking the incoming clock when FB_COMP is high, the converter will skip pulses to prevent the output voltage VOUT 130 from having a runaway problem and maintain voltage regulation on VOUT 130 if this condition occurs.

In this description, "terminal," "node," "interconnection," "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground and/or any other form of ground connection applicable to, or suitable for, the teachings of this description.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, so device B is controlled by device A via the control signal generated by device A.

In this description, even if operations are described in a particular order, some operations may be optional, and the operations are not necessarily required to be performed in that particular order to achieve specified results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A circuit comprising:
an amplifier having an amplifier output and first and second amplifier inputs, in which the first amplifier input is coupled to a reference voltage terminal, and the second amplifier input is coupled to an output voltage terminal;
a comparator having a comparator output and first and second comparator inputs, in which the first comparator input is coupled to the amplifier output, and the second comparator input is coupled to a switching terminal;
a logic circuit having first, second and third logic inputs and first and second logic outputs, in which the first logic input is coupled to the comparator output, and the second logic input is coupled to a clock terminal;
a driver circuit having first and second driver inputs and first and second driver outputs, in which the first driver input is coupled to the first logic output, and the second driver input is coupled to the second logic output;
a first transistor coupled between a supply voltage terminal and the switching terminal and having a first control terminal, in which the first control terminal is coupled to the first driver output;
a second transistor coupled between the switching terminal and a ground terminal and having a second control terminal, in which the second control terminal is coupled to the second driver output;
a threshold detection circuit having a threshold detection input and a threshold detection output, in which the threshold detection input is coupled to the second transistor, the threshold detection output is coupled to the third logic input, and the threshold detection circuit is configured to provide a threshold signal at the threshold detection output responsive to a current through the second transistor crossing a current threshold; and
a slope compensation circuit coupled between the second comparator input and the output voltage terminal, wherein the slope compensation circuit includes:
a capacitor coupled between the second comparator input and a compensation terminal;

a resistor coupled between the compensation terminal and the output voltage terminal; and a third transistor having a third control terminal, in which the third transistor is coupled between the compensation terminal and the ground terminal, and the third control terminal is coupled to the second driver output.

2. The circuit of claim 1, further comprising:

a capacitor coupled between the second comparator input and the output voltage terminal; and a resistor coupled between the switching terminal and the second comparator input.

3. The circuit of claim 2, wherein the capacitor is a first capacitor, and the circuit further comprises a second capacitor coupled between the first comparator input and the ground terminal.

4. The circuit of claim 1, further comprising an inductor coupled between the switching terminal and the output voltage terminal.

5. The circuit of claim 4, further comprising:

a capacitor coupled between the output voltage terminal and the ground terminal; and a resistor coupled between the output voltage terminal and the ground terminal.

6. The circuit of claim 1, wherein the current threshold is zero.

7. The circuit of claim 1, wherein the logic circuit includes a state machine configured to control turning the first transistor on or off and turning the second transistor on or off.

8. The circuit of claim 7, wherein the logic circuit includes an edge detection circuit having an edge detection input and an edge detection output, wherein the edge detection input is coupled to the clock terminal, and the edge detection output is coupled to the state machine.

9. The circuit of claim 7, wherein the state machine has three states.

10. The circuit of claim 7, wherein the state machine is configured to turn off the first and second transistors responsive to the threshold signal.

11. A voltage regulator circuit, comprising:

an amplifier having an amplifier output and first and second amplifier inputs, wherein the first amplifier input is coupled to a reference voltage terminal, and the second amplifier input is coupled to an output voltage terminal;

a comparator having a comparator output and first and second comparator inputs, wherein the first comparator input is coupled to the amplifier output, and the second comparator input is coupled to a switching terminal;

a state machine having first, second and third state inputs and first and second state outputs, wherein the first state input is coupled to the comparator output, and the second state input is coupled to a clock terminal;

a driver circuit having first and second driver inputs and first and second driver outputs, wherein the first driver input is coupled to the first state output, and the second driver input is coupled to the second state output;

a first transistor coupled between a supply voltage terminal and the switching terminal and having a first control terminal, wherein the first control terminal is coupled to the first driver output;

a second transistor coupled between the switching terminal and a ground terminal and having a second control terminal, in which the second control terminal is coupled to the second driver output; and a slope compensation circuit coupled between the second comparator input and the output voltage terminal, wherein the slope compensation circuit includes:

a capacitor coupled between the second comparator input and a compensation terminal;

a resistor coupled between the compensation terminal and the output voltage terminal; and a third transistor having a third control terminal, in which the third transistor is coupled between the compensation terminal and the ground terminal, and the third control terminal is coupled to the second driver output.

12. The voltage regulator circuit of claim 11, further comprising a threshold detection circuit having a threshold detection input and a threshold detection output, wherein the threshold detection input is coupled to the second transistor, the threshold detection output is coupled to the third state input, and the threshold detection circuit is configured to provide a threshold signal at the threshold detection output responsive to a current through the second transistor crossing a current threshold.

13. The voltage regulator circuit of claim 12, further comprising an inductor coupled between the switching terminal and the output voltage terminal.

14. The voltage regulator circuit of claim 12, wherein the state machine is configured to turn off the first and second transistors responsive to the threshold signal.

15. The voltage regulator circuit of claim 12, further comprising:

a capacitor coupled between the output voltage terminal and the ground terminal; and a resistor coupled between the output voltage terminal and the ground terminal.

16. The voltage regulator circuit of claim 11, wherein the state machine has three states.

17. The voltage regulator circuit of claim 11, wherein the state machine includes an edge detection circuit having an edge detection input and an edge detection output, wherein the edge detection input is coupled to the clock terminal, and the edge detection output is coupled to the state machine.

* * * * *